(12) United States Patent
Hackl (10) Patent No.: US 11,005,256 B2
(45) Date of Patent: May 11, 2021

(54) METHOD FOR THE CONTINUOUS INSULATION MONITORING OF AN ELECTRICAL CONDUCTOR ARRANGEMENT

(71) Applicant: BENDER GMBH & CO. KG, Gruenberg (DE)

(72) Inventor: Dieter Hackl, Fernwald (DE)

(73) Assignee: BENDER GMBH & CO. KG, Gruenberg (DE)

( * ) Notice: Subject to any disclaimer, the term of this patent is extended or adjusted under 35 U.S.C. 154(b) by 126 days.

(21) Appl. No.: 16/404,820

(22) Filed: May 7, 2019

(65) Prior Publication Data
US 2019/0348830 A1 Nov. 14, 2019

(30) Foreign Application Priority Data
May 8, 2018 (DE) ...................... 10 2018 111 061.8

(51) Int. Cl.
*H02H 5/10* (2006.01)
*G01R 31/58* (2020.01)

(52) U.S. Cl.
CPC ............. *H02H 5/105* (2013.01); *G01R 31/58* (2020.01)

(58) Field of Classification Search
CPC .......... H02H 3/335; H02H 3/338; H02H 5/10; H02H 5/105; H01H 83/04; G01R 31/58; G01R 31/59; G01R 31/50; G01R 27/025; G01R 27/18; E21B 47/001; E21B 17/003
See application file for complete search history.

(56) References Cited

U.S. PATENT DOCUMENTS

| | | | |
|---|---|---|---|
| 4,301,399 A | 11/1981 | Miller et al. | |
| 6,265,880 B1 | 7/2001 | Born et al. | |
| 2002/0038199 A1 | 3/2002 | Blemel | |
| 2012/0126839 A1* | 5/2012 | Schaefer | G01R 27/18 324/750.01 |
| 2015/0255976 A1* | 9/2015 | Hackl | H02H 3/162 361/47 |

(Continued)

FOREIGN PATENT DOCUMENTS

| | | |
|---|---|---|
| CN | 203825089 U | 9/2014 |
| DE | 69022282 | 11/1990 |

(Continued)

*Primary Examiner* — Adolf D Berhane
(74) *Attorney, Agent, or Firm* — King & Schickli, PLLC (57) ABSTRACT

Method for the continuous insulation monitoring of an electrical conductor arrangement (12) with an active conductor (3) and a conductor structure (14) electrically insulated from the active conductor (3), wherein the quality of the conductor arrangement (12) as well as the arrangement of the active conductor (3) and the conductor structure (14) is such that almost identical propagation conditions for the active conductor (3) and the conductor structure (14) apply to a current flow against ground (E), wherein an insulation resistance measurement is being carried out, wherein an insulation monitoring unit (20) is connected between the conductor structure (14) and ground (E), which superimposes a measurement voltage onto the electrical conductor arrangement (12), which generates a measurement current proportionally to the insulation resistance of the conductor arrangement (12), which is acquired in the insulation resistance measurement unit (20) and evaluated.

6 Claims, 5 Drawing Sheets

(56) References Cited

U.S. PATENT DOCUMENTS

| | | | | |
|---|---|---|---|---|
| 2017/0222427 A1* | 8/2017 | Davis | ............... | H02H 5/105 |
| 2019/0339314 A1* | 11/2019 | Herber | ............... | G01R 27/18 |
| 2020/0025813 A1* | 1/2020 | Hackl | ............... | G01R 27/02 |
| 2020/0081072 A1* | 3/2020 | Hackl | ............... | G01R 31/42 |

FOREIGN PATENT DOCUMENTS

| | | |
|---|---|---|
| DE | 69114452 T2 | 5/1996 |
| DE | 10000551 C1 | 7/2001 |
| DE | 10344421 A1 | 4/2005 |
| DE | 102005052956 B3 | 5/2007 |
| FR | 2781574 A1 | 1/2000 |

* cited by examiner

Fig. 1
(Most recent background art)

Fig. 2
(Most recent background art)

METHOD FOR THE CONTINUOUS INSULATION MONITORING OF AN ELECTRICAL CONDUCTOR ARRANGEMENT

The disclosure of German Patent Application No. 10 2018 111 061.8, filed May 8, 2018, is incorporated herein by reference.

TECHNICAL FIELD

The invention relates to a method for the continuous insulation monitoring of an electrical conductor arrangement with an active conductor and a conductor structure that is electrically insulated from the active conductor.

BACKGROUND

The intensified use of electro-technical and electronic components in innovative technologies, for example, electro-mobility or photovoltaics, brings up new questions with regard to the electronic insulation characteristics of the operating equipment used.

Thereby, for example, the normative requirements of insulation coordination for electrical operating equipment in low-voltage systems are described in the IEC 60664 standards series. Thereby, requirements are made concerning clearances and creepage distances to be upheld and requirements for solid insulations are defined. This norm has the status of a basic safety standard and is therefore considered to be a basis for defining requirements in the field of insulation coordination by various installation and product standards.

However, the analyses carried out at the point in time the norm emerged are mainly based on the use of single- or multiphase AC power supply systems. The use of frequency converter technologies at the point in time research activities had been carried out was not as widespread as it is today when introducing the new technologies mentioned in the above.

In particular, the mixed voltages consisting of alternating voltages, direct voltages and switching-frequency voltage components, which are typical in the converter applications of today, were also not considered.

Therefore, within the scope of current research projects, analyses were carried out concerning the standard dimensioning of clearance and creepage distances on circuit boards, wherein different combinations consisting of direct-current amplitudes, circuit board material and protective coating were taken under consideration. As a result, under the influence of moisture/heat cycles, migration effects were determined, which may cause arcing and fires over the course of time.

The research results revealed that a formation of migration effects can already be detected in the run-up due to a decrease in insulation resistance range from 1 to 10 GOhm in good condition to values under 100 MOhm in poor condition.

Other analyses and evaluations of high-voltage-technology operating equipment reach the conclusion that a limit value above 100 MOhm must be set for determining that insulation systems are in good condition.

In the case of practically implementing diagnostic measurements, in particular for measuring insulation resistance, it has been proven to be a disadvantage that, with just a few exceptions, these measurements can only be carried out within the scope of maintenance measures, meaning off-line on the switched-off system part. Firstly, the non-availability of the supply system during diagnostic measurements, secondly the high level of effort required for system conversion in order to make diagnostic measurements possible, and thirdly, the unobserved times between maintenance intervals are problematic.

The use of known measurement and testing equipment, which are used off-line for the diagnostic measurements described in the above during the course of maintenance work, as online monitoring units is not possible in light of past experience since external and interference voltages present during online operation would adversely affect the measurements too much.

However, the use of insulation monitoring technology for evaluating the insulation condition of systems, operating equipment or subsystems (circuit boards), which is particularly widespread in the low-voltage sector, seems conceivable since the measurement technology used in insulation monitoring units is designed to be robust in order to provide an accurate measurement result under the influence of existing external and interference voltages.

However, the use of these known insulation monitoring units designed according to standard for evaluating the insulation condition is only possible in systems with an unearthed type of electrical system (IT system) and there, only if the insulation resistance value of the overall system is considerably above the apparently critical 100 MOhm limit.

In addition, insulation monitoring units within the field of oil and gas supply are used with a GOhm measuring range. Here however, in order not to allow the insulation level of the overall system to drop under a critical value, parts of the power supply system must unfavourably be switched off via disconnection devices. In the case of this approach, insulation resistance measurements are also meaningful with regard to the insulation condition of underwater power cables (umbilical) for example. However, for assessing relevance, the comparison with measurement values that have been taken at an initial or proceeding point in time is important.

From these perspectives, on the one hand, the problem arises that an accurate determination of the insulation resistance using common insulation monitoring technology is only possible if the insulation level of the overall power supply system is sufficiently high, thereby being above 100 MOhm. In order to counteract this problem, a plurality of solutions are known from the most recent background art. In the foreground, there is the temporary disconnection of subsystems with a low level of insulation in order to be able to determine the insulation resistance of the remaining system in a sufficiently reliable manner. Then, a comparison with the preceding measurements takes place during the same operating state.

Other known measures include shortening maintenance intervals and shortening the intervals between the normatively required iterative tests. An early exchange of critical operating equipment in connection with stocking replacement parts and keeping standby services available can also indirectly contribute to increasing electrical safety.

However, the known measures are subject to disadvantages. Thus, insulation monitoring units according to standard can only be used in unearthed power supply systems and a disconnection of subsystems is not always possible, for example, not in medical fields of application, and maintenance intervals in connection with extensive stockholding can lead to higher costs.

SUMMARY

The object of the present invention is to propose a method which makes a continuous insulation monitoring of an electrical conductor arrangement (power supply system) possible, which comprises a conductor structure that is electrically insulated from the active conductor. The method should be particularly applicable in cases where the overall insulation resistance drops due to interconnecting system parts, as well as both for earthed as well as for unearthed power supply systems.

In connection with the features in the preamble of claim 1, it is required that the quality of the conductor arrangement, as well as the arrangement of the active conductor and the conductor structure are designed in such a way that influencing factors, which are suited to influence the insulation resistance of the conductor arrangement, act both on the active conductor as well as the conductor structure on an equal level. Almost identical propagation conditions are assumed for a measurement current flowing over the active conductor, as well as for a measurement flowing over the conductor structure.

This task is achieved by means of an insulation resistance measurement being carried out, wherein an insulation monitoring unit is connected between the conductor structure and ground, which superimposes a measurement voltage onto the electrical conductor arrangement, which generates a measurement current proportionally to the insulation resistance of the conductor arrangement, which is acquired in the insulation resistance measurement unit and evaluated.

The active conductors can be designed to be insulated against ground, be grounded in a low-impedance manner or grounded in a high-impedance manner. Thereby, all mains types are covered. The conductor structure is not only designed to be electrically insulated against the active conductor but also against ground—depending on the measurement task at hand, being electrically insulated in a very high-impedance manner.

The basic idea of the present invention is based on the assumption that a deterioration of the insulation state due to possible influencing factors almost always acts symmetrically on the insulation and this field of action is not limited to the active conductor of the conductor arrangement but extends to adjacent conductor structures. For example, temperature/humidity cycles influence all isolation regions that are exposed to these cycles.

It is therefore not necessary to apply a measurement voltage to the active conductor carrying the operating current but apply the measurement voltage to a spatially adjacent conductor structure of the conductor arrangement, which is exposed to the same influencing factors.

The measurement current flowing over this conductor structure, the insulation and over the ground can thereby favourably form a measurement path, which has a higher (insulation) resistance value so that an insulation monitoring unit according to standard can be used.

Using a circuit board as an electrical conductor arrangement as an example, this means that a degradation or worsening of the protective or insulating varnish is not only determinable by means of an insulation resistance measurement on an active conductor against ground, but also on any conductor structure insulated from the active conductors, said structure also being embedded into the protective or insulating varnish. Thereby, the use of a standard insulation monitoring unit for determining the insulation resistance is of an advantage since, in the case of a decreasing insulation level of the conductor arrangement, an increasing interference voltage level on the monitored conductor structure can be expected, however an insulation monitoring unit in accordance with the most recent background art is capable of eliminating these interference voltages.

With the scope of the task of continuous insulation monitoring, it is assumed that such an insulation monitoring unit also tolerates voltage components that may occur between the active conductors and the ground and that may considerably fluctuate depending on the application at hand.

In another favourable embodiment, one or a plurality of conductors of the conductor arrangement, which do not carry operating current, are used as a conductor structure.

In the case of a power supply cable as a conductor arrangement, this means that a degradation or a worsening of the insulation of an active conductor in the power supply cable can be estimated by measuring the insulation resistance on one or a plurality of unused conductors, which do not carry operating current, which are arranged in a manner insulated from the active conductors in the same cable bundle, thereby being subjected to the same interference factors, for example, environmental influences, such as temperature or humidity.

Furthermore, a shielding layer can advantageously be used as a conductor structure.

The shielding layer can be an electrical semi-conductor or an electrical conductor. In this way, in the case of an underwater power supply line, it is conceivable to measure the insulation resistance between the semi-conductive shielding layer against ground in order to detect the entry of water for example.

Furthermore, in the case of a transformer as a conductor arrangement, a capacitively earthed shielding winding of the transformer can be used as a conductor structure.

A reduction in the insulation resistance value measured between the capacitively earthed shielding winding and earth, for example, due to humidity/heat cycles, can be assessed as an indicator for a critical state of the insulation system of the transformer.

The method according to the invention can favourably be used for the continuous insulation monitoring of an electrical conductor arrangement of both an unearthed, as well as an earthed power supply system.

The method according to the invention thereby makes it possible to carry out a continuous monitoring of the insulation state of conductor arrangements independently of the type of electrical system (earthed or unearthed power supply system). A continuous monitoring during operation increases the electrical safety of the conductor arrangement to be monitored and avoids operational downtime.

The technical measurement possibilities of the current insulation monitoring technique leading into the GOhm range can thereby be favourably be used according to the invention for the monitoring of the conductor arrangement, in particular, the cable insulation in electrical systems or in the case of monitoring the insulation of operating equipment, even if the insulation level, for example, of an unearthed power supply system would be too low to make an insulation monitoring possible in accordance with the most recent background art.

Furthermore, the method according to the invention is suitable for earthed power supply systems.

BRIEF DESCRIPTION OF THE DRAWINGS

Other favourable embodiment features result from the following description and the drawings, which explain a preferred embodiment of the invention as well as applications of the invention based on examples. The figures show.

DETAILED DESCRIPTION

Figure 1:
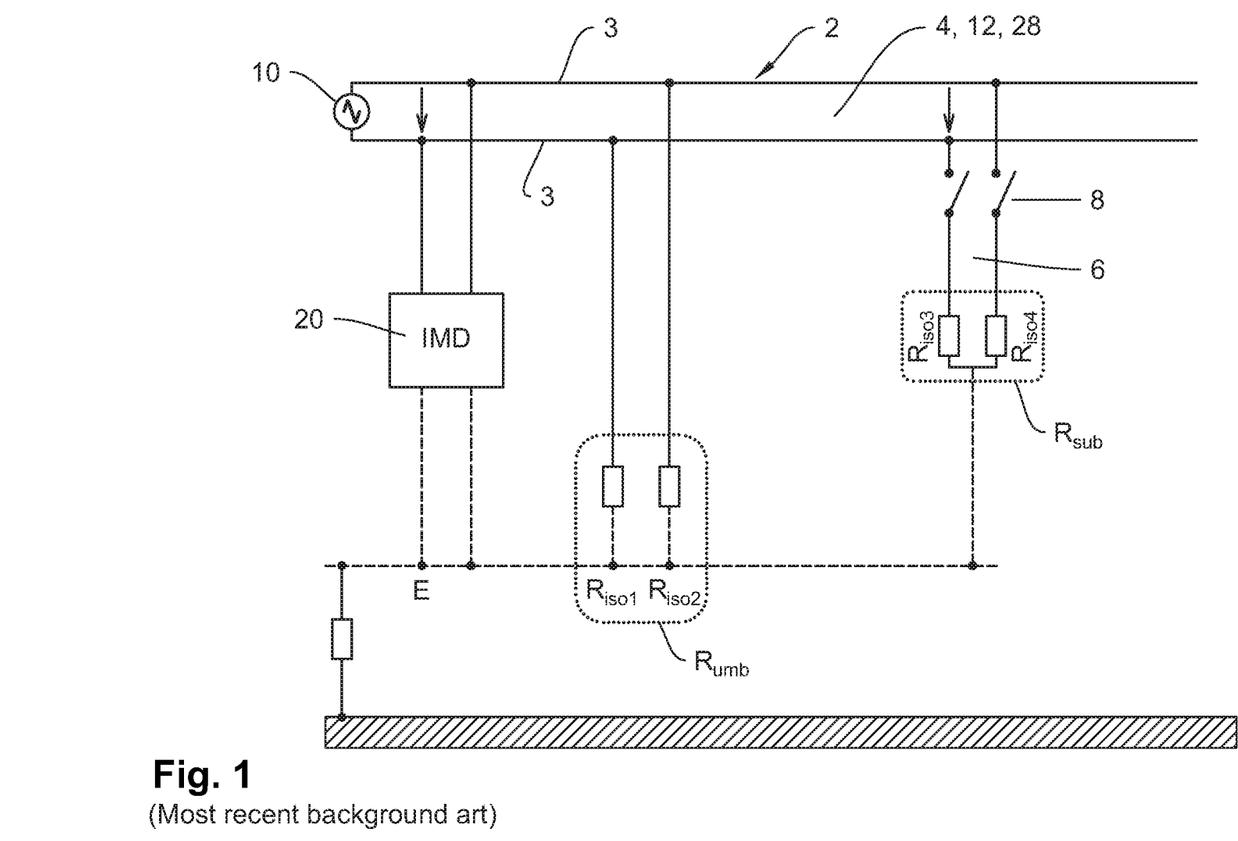
FIG. 1: schematically, a branched unearthed power supply system for illustrating the problem.

In order to illustrate the problem, a power supply system 2 is shown in FIG. 1, which consists of a main system 4 and a subsystem 6 and is powered by a power source 10. The main system 4 represents a conductor arrangement 12, which comprises two active conductors 3. In the present example, the conductor arrangement 12 is designed as an underwater power supply line 28 (see FIG. 4).

The main system 4 as well as the subsystem 6 are respectively characterized by the insulation resistances $R_{iso1}$ to $R_{iso4}$. According to the most recent background art, for insulation resistance measurement, an insulation monitoring unit 20 according to standard is connected between the active conductor 3 and the earth E. The insulation monitoring unit 20 superimposes a measurement voltage on to the power supply system 2, wherein the measurement current circuit is formed in an earthed manner via the active conductor 3 and the insulation resistances $R_{iso1}$ to $R_{iso4}$. The insulation resistance $R_{umb}$ of the main system 4 results from the parallel connection of the insulation resistance $R_{iso1}$ and the insulation resistance $R_{iso2}$; the insulation resistance $R_{sub}$ of the subsystem 6 results from the parallel connection of the insulation resistance $R_{iso3}$ and the insulation resistance $R_{iso4}$. In turn, the overall insulation resistance of the power supply system 2 results from the parallel connection of the insulation resistance $R_{umb}$ of the main system 4 and the insulation resistance $R_{sub}$ of the subsystem 6. Due to the parallel connection of the insulation resistances $R_{iso1}$ to $R_{iso4}$, the insulation level of the power supply system 2 decreases. Against the background of the special task of determining the insulation resistance of individual system parts of an unearthed power supply system, the isolation level of which is considerably higher—by powers of 10 higher—these system parts insulated against ground in a very high-impedance manner must be separated. In addition, in accordance with the most recent background art, circuit breakers 8 for switching off the subsystem 6 are provided. These circuit breakers are used to disconnect from the main system 4, which is insulated against ground in much higher-impedance manner with relation to the subsystem 6, which is insulated against ground in a much lower-impedance manner.

In practice, this circuit breakers 8 stand for a multitude of circuit breakers that make a separation from a multitude of subsystems 6 possible. In an unfavourable way, the effort for a disconnection operation is remarkably high since this disconnection must take place at depths of several thousands of metres in the sea using robots.

If, for example, the conductor arrangement 12 is designed as an underwater power supply line 28 (FIG. 4), it is therefore attempted to increase the overall insulation level by selectively switching off system parts at a range of the overall insulation resistance above 100 MOhm.

Figure 2:
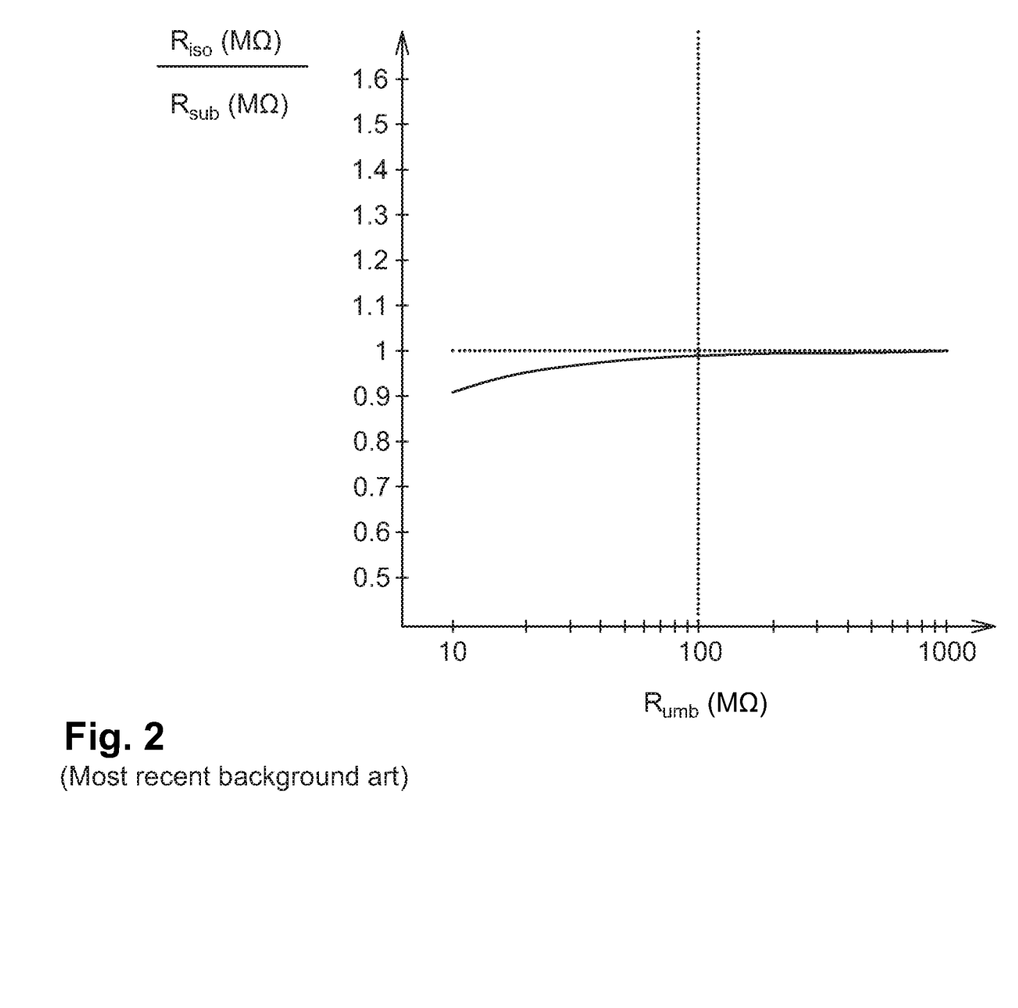
FIG. 2: the progression of an overall insulation resistance

FIG. 2 shows in a diagram the ratio of the overall insulation resistance $R_{iso}$ of the power supply system 2 to the insulation resistance $R_{sub}$ of the subsystem 6 depending on the insulation resistance $R_{umb}$ of the main system 4.

The expected low level of change of the overall insulation resistance value $R_{iso}$ determined by the insulation monitoring unit 20 in the case of a parallel connection of the subsystem 6 with an insulation level of approx. one MOhm and an insulation resistance $R_{umb}$ of the main system 4 designed as an underwater power supply cable 28, which varies between 10 MOhm and 1 GOhm, can be clearly recognized.

Based on the measured overall insulation resistance $R_{iso}$, in this example, a statement concerning the state of the insulation of the main system 4 (conductor arrangement 12 in the form of the underwater power supply line 28) can hardly be made.

Figure 3:
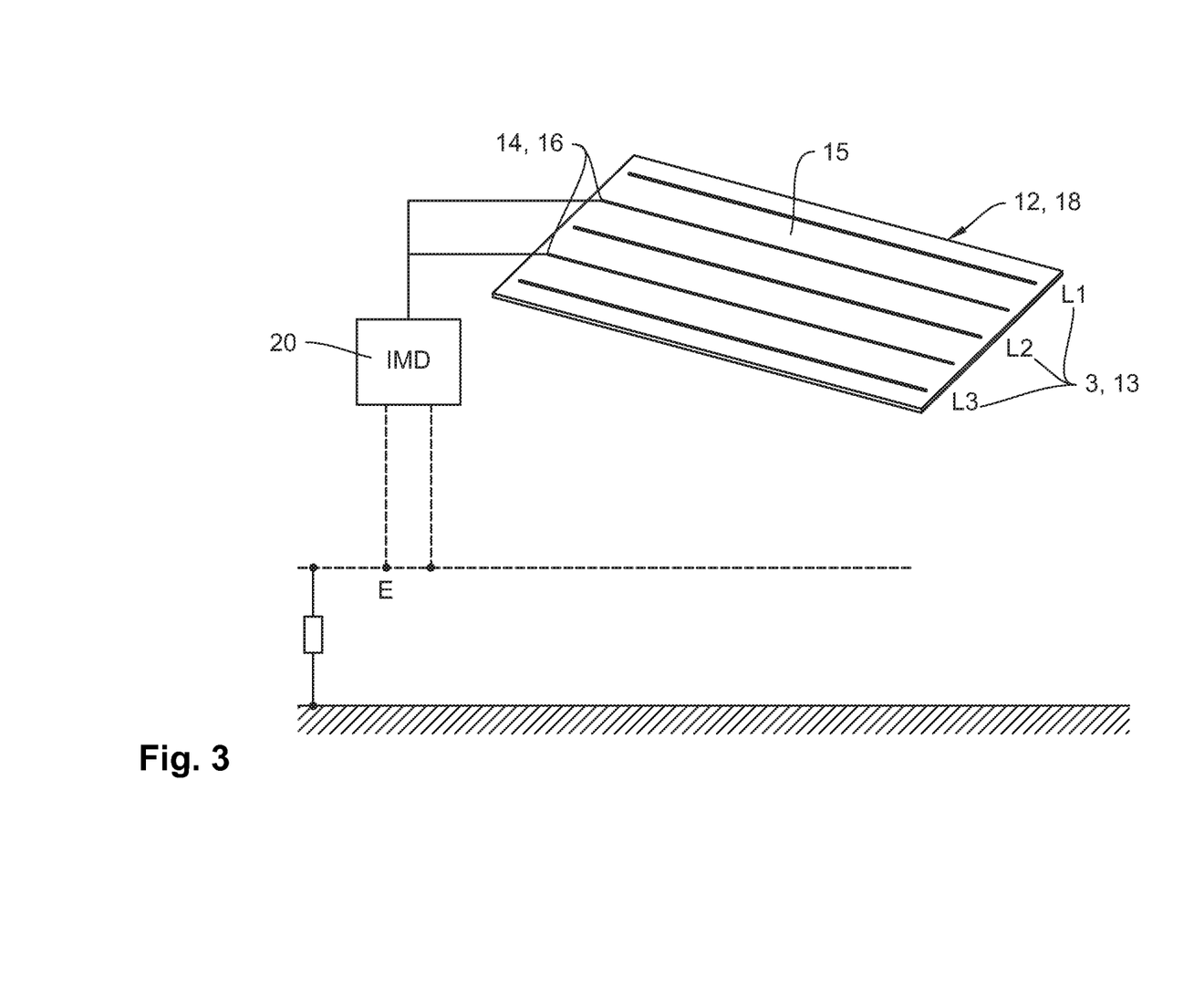
FIG. 3: an application of the method according to the invention in connection with a circuit board.

FIG. 3 shows the application of the method according to the invention on a conductor arrangement 12 designed as a circuit board 18. The conductor arrangement 12 comprises conductor tracks 13 as active conductors 3 and other conductor tracks 16 as a conductor structure 14. Deviating from the most recent background art, the insulation monitoring unit 20 is not coupled to the active conductor tracks 13 but to the other conductor tracks 16, which are embedded into a common insulating varnish layer 15, thereby being insulated from the active conductors 3, 13. According to the preamble of Claim 1, the requirement also applies here that the insulating varnish layer 15 exerts the same influence on both the active conductors 3, 13 as well as the other conductor tracks 16 with regard to the determination of an insulation resistance. The other conductor tracks 16 are thereby exposed to the same influencing factors, which influence the quality of the insulation. The measurement of the overall insulation resistance $R_{iso}$ on the conductor structure 14 thereby allows for an assessment of the insulation state of the common insulating varnish layer 15 to be made without having to apply a voltage to the active conductors 3, 13.

Since the active conductors 3, 13 are not integrated into the measurement current circuit, there is also no need to interrupt the operation of the conductor arrangement 12 in order to carry out an insulation resistance measurement.

Figure 4:
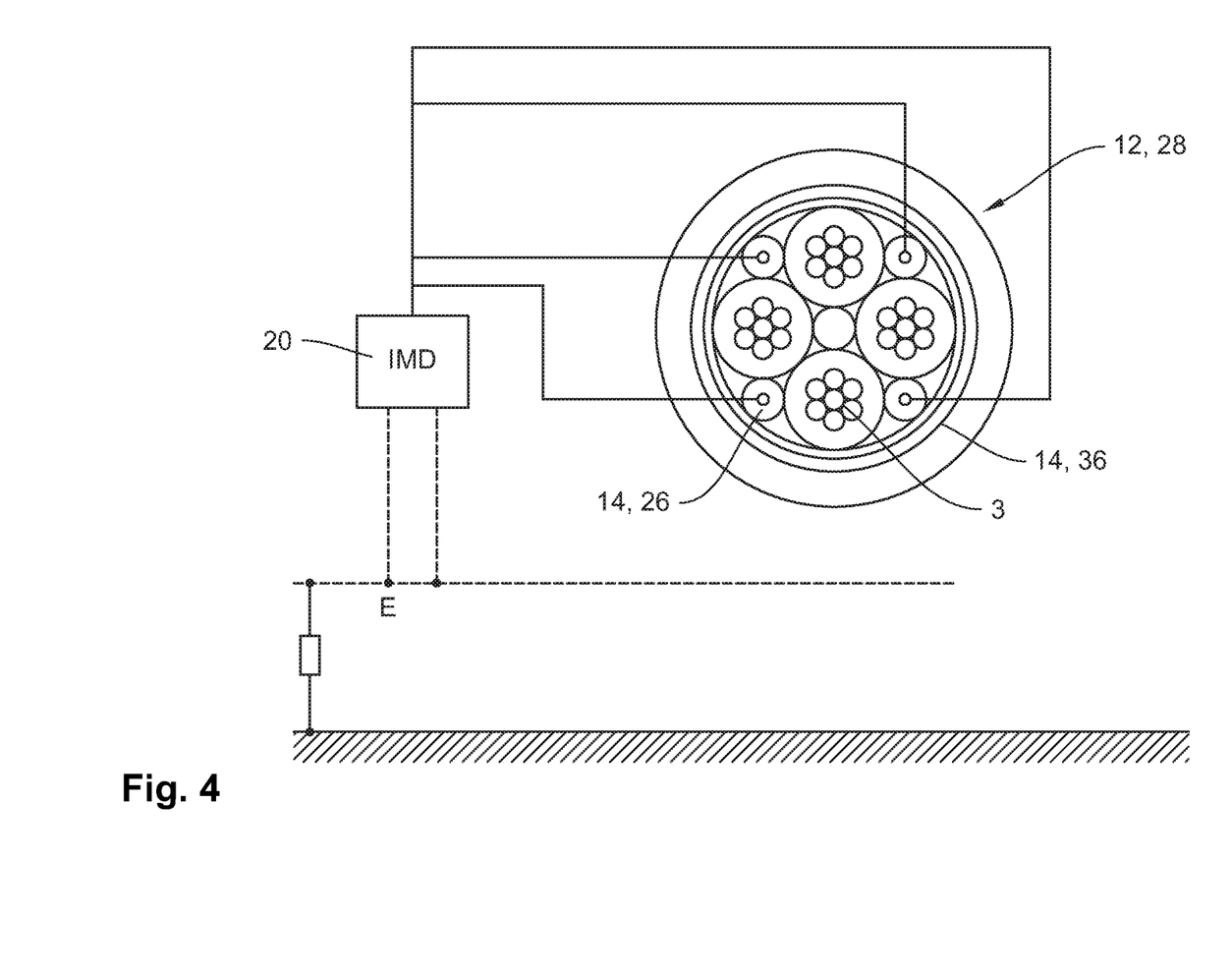
FIG. 4: an application of the method according to the invention in connection with an underwater power supply line

FIG. 4 shows an application of the method according to the invention from the oil and gas supply sector where the conductor arrangement 12 is designed as an underwater power supply line 28. The underwater power supply line 28 here encloses four active conductors 3 as well as four unused conductors 26, which do not carry operating current, as a conductor structure 14. The insulation monitoring unit 20 is coupled to this conductor structure 14 consisting of the unused conductors 26. Since the conductor structure 14 is also exposed to the same environmental influences here as the active conductor 3, here, an approximate estimation of the insulation state of the conductor arrangement 12 can be made.

In addition or as an alternative to coupling the insulation monitoring unit 20 to the unused conductors 26, which do not carry operating current, a conducting or a semi-conducting shielding layer 36 of the conductor arrangement 12 designed as an underwater power supply line 28 can be used as a conductor structure 14.

Figure 5:
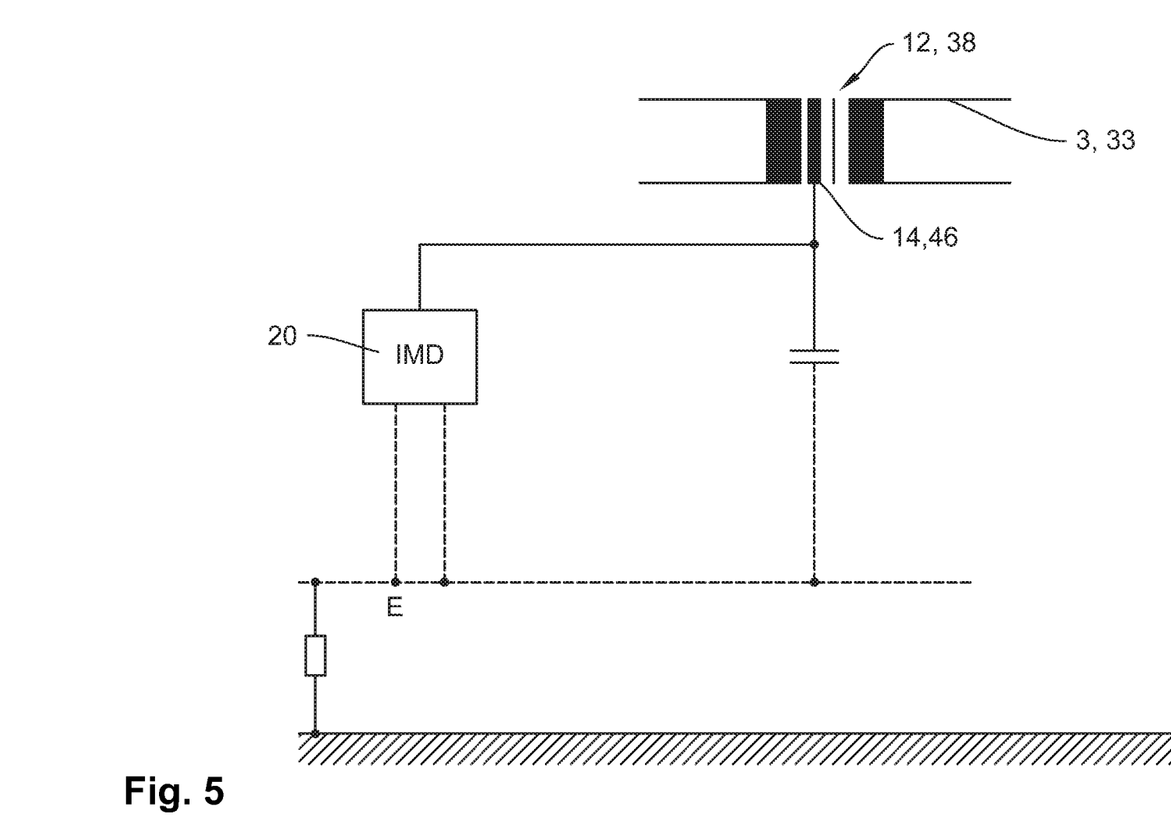
FIG. 5: an application of the method according to the invention in connection with a transformer

FIG. 5 shows an application of the method according to the invention in connection with a conductor arrangement 12, which is designed as a transformer 38.

In addition to the active transformer windings 33, the transformer 38 comprises a conductor structure 14 designed as a shielding winding 46. The insulation monitoring unit 20 is coupled to this shielding winding 46. Here as well, the measurement current, which flows within the measurement circuit formed via the shielding winding 46, provides an indication concerning the insulation state of the transformer 38.

If, for example, the insulation state should deteriorate due to an excess formation of moisture in the transformer 38 and, thereby, the insulation state declines, this would be determined by an increase of the measurement current in the insulation monitoring unit 20.

The invention claimed is:

1. A method for the continuous insulation monitoring of an electrical conductor arrangement (12) with an active conductor (3) and a conductor structure (14) electrically insulated from the active conductor (3), wherein the quality of the conductor arrangement (12) as well as the arrangement of the active conductor (3) and the conductor structure (14) is such that almost identical propagation conditions for the active conductor (3) and the conductor structure (14) apply to a current flow against ground (E), comprising the method steps:
carrying out an insulation resistance measurement, wherein an insulation monitoring unit (20) is connected between the conductor structure (14) and ground (E), which superimposes a measurement voltage onto the electrical conductor arrangement (12), which generates a measurement current proportionally to the insulation resistance of the conductor arrangement (12) without integrating the active conductor (3) into a measurement circuit, the measurement current being acquired in the insulation resistance measurement unit (20) and evaluated.

2. The method according to claim 1, characterized in that one or a plurality of conductors (26), not carry operating current, of the conductor arrangement (12) is/are used as the conductor structure (14).

3. The method according to claim 1, characterized in that a shielding layer (36) is used as a conductor structure (14).

4. The method according to claim 1, characterized in that, in the case of a transformer (38) as a conductor arrangement (12), a capacitively earthed shielding winding (46) of the transformer (38) is used as a conductor structure (14).

5. An application of the method according to claim 1, for the continuous insulation monitoring of an electrical conductor arrangement (12) of an unearthed power supply system (2).

6. An application of the method according to claim 1 for the continuous insulation monitoring of an electrical conductor arrangement of an earthed power supply system.

* * * * *